US010840899B2

United States Patent
Takada

(10) Patent No.: US 10,840,899 B2
(45) Date of Patent: Nov. 17, 2020

(54) MOTOR DRIVE DEVICE AND ELECTRIC POWER STEERING DEVICE

(71) Applicant: Nidec Corporation, Kyoto (JP)

(72) Inventor: Tomoyuki Takada, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/469,661

(22) PCT Filed: Dec. 28, 2017

(86) PCT No.: PCT/JP2017/047189
§ 371 (c)(1),
(2) Date: Jun. 14, 2019

(87) PCT Pub. No.: WO2018/142829
PCT Pub. Date: Aug. 9, 2018

(65) Prior Publication Data
US 2020/0083880 A1 Mar. 12, 2020

(30) Foreign Application Priority Data

Jan. 31, 2017 (JP) .................................. 2017-016245
May 16, 2017 (JP) .................................. 2017-097570

(51) Int. Cl.
*H02P 27/06* (2006.01)
*H02M 1/32* (2007.01)
(Continued)

(52) U.S. Cl.
CPC ....... *H03K 17/08142* (2013.01); *B62D 5/046* (2013.01); *H02H 7/0844* (2013.01); *H02M 1/32* (2013.01); *H02P 27/06* (2013.01)

(58) Field of Classification Search
CPC ......... H03K 17/0814; B62D 5/04; H02H 7/08
(Continued)

(56) References Cited

U.S. PATENT DOCUMENTS 6,653,745 B1 * 11/2003 Masaki .................. B60L 58/20
307/10.1
2006/0170448 A1 * 8/2006 Childers .............. G01R 31/343
324/765.01
(Continued)

FOREIGN PATENT DOCUMENTS

JP 2009-220705 A 10/2009
JP 2015-047035 A 3/2015
JP 2017-022828 A 1/2017

OTHER PUBLICATIONS

Official Communication issued in International Patent Application No. PCT/JP2017/047189, dated Apr. 3, 2018.

*Primary Examiner* — Bentsu Ro
(74) *Attorney, Agent, or Firm* — Keating & Bennett, LLP

(57) ABSTRACT

A motor drive device includes an inverter circuit, a switching circuit that switches between conduction and interruption between a power supply and the inverter circuit, and a switching driver that outputs, to the switching circuit, a command voltage which commands a switching operation. The switching circuit includes a first field-effect transistor (FET) and a second FET connected in series with sources of each other in order from a side of the power supply, and the switching driver includes an output circuit that outputs an interruption command voltage in a case in which a potential difference between drains of the FETs exceeds a threshold value, and a delay circuit that causes a timing at which the command voltage is input to a gate of the first FET to be later than a timing at which the command voltage is input to a gate of the second FET.

9 Claims, 8 Drawing Sheets

(51) Int. Cl.
*H03K 17/0814* (2006.01)
*B62D 5/04* (2006.01)
*H02H 7/08* (2006.01)

(58) Field of Classification Search
USPC ............................................... 318/560, 280
See application file for complete search history.

(56) References Cited

U.S. PATENT DOCUMENTS

| | | | |
|---|---|---|---|
| 2011/0205672 A1* | 8/2011 | Sakai | B62D 5/0487 361/18 |
| 2011/0273122 A1 | 11/2011 | Murata et al. | |
| 2012/0161681 A1* | 6/2012 | Kuroda | B62D 5/0481 318/400.21 |
| 2015/0012161 A1 | 1/2015 | Kanekawa et al. | |
| 2016/0134212 A1 | 5/2016 | Kikuchi et al. | |
| 2017/0297612 A1* | 10/2017 | Uryu | B62D 5/0481 |
| 2017/0317512 A1* | 11/2017 | Sung | H02J 7/0068 |
| 2018/0004237 A1* | 1/2018 | Morimoto | H02J 1/00 |

* cited by examiner

MOTOR DRIVE DEVICE AND ELECTRIC POWER STEERING DEVICE

CROSS REFERENCE TO RELATED APPLICATIONS

This is the U.S. national stage of PCT Application No. PCT/JP2017/047189, filed on Dec. 28, 2017, and priority under 35 U.S.C. § 119(a) and 35 U.S.C. § 365(b) is claimed from Japanese Application No. 2017-016245, filed Jan. 31, 2017 and Japanese Application No. 2017-097570, filed on May 16, 2017; the entire disclosures of which are incorporated herein by reference.

FIELD OF THE INVENTION

The present disclosure relates to a motor drive device and an electric power steering device.

BACKGROUND

As a motor drive device that drives a motor used in an electric power steering device and the like, a motor drive device including a switching circuit configured to switch a current supply path between an inverter circuit and a power supply to a conducting state and an interrupted state is known. In a case in which a current value of current flowing through the current supply path between the inverter circuit and the power supply exceeds a predetermined threshold value, a switching circuit switches the current supply path between the inverter circuit and the power supply to the interrupted state.

At the time of switching from the conducting state to the interrupted state, for example, a surge voltage is generated due to an influence of an inductance of a choke coil for noise reduction that is included in a switching circuit. Depending on the magnitude of the surge voltage, the surge voltage may exceed the maximum rating of a switching element, such as a field-effect transistor (FET), included in the switching circuit, and the switching element may be damaged. This can lead to a malfunction of an electric power steering device.

Conventionally, a related art discloses a motor drive device that turns off two emergency switching elements which are connected in series in a case in which a feed line to a motor is not energized, thereby preventing damage to the emergency switching elements.

Here, in a case in which two emergency switches which are connected in series are turned off simultaneously, one of the two emergency switches is damaged due to generation of a surge voltage. In the related art, there is no description regarding an order of turning off two emergency switches.

SUMMARY

An example embodiment of the present disclosure is a motor drive device that drives a motor, the motor drive device including an inverter circuit that supplies a current supplied from an external power supply to the motor, a switching circuit that switches a current supply path between the external power supply and the inverter circuit to a conducting state and an interrupted state, and a switching driver that outputs a voltage that commands a switching operation to the switching circuit. The switching circuit includes a first field-effect transistor (FET) and a second FET connected in series with each other's sources from the external power supply, and the switching driver includes an output circuit that outputs an interruption command voltage which commands switching of the current supply path from the conducting state to the interrupted state in a case in which a potential difference between a drain of the first FET and a drain of the second FET exceeds a predetermined threshold value, and a delay circuit that causes a first timing at which the interruption command voltage is input to a gate of the first FET to be later than a second timing at which the interruption command voltage is input to a gate of the second FET.

The above and other elements, features, steps, characteristics and advantages of the present disclosure will become more apparent from the following detailed description of the example embodiments with reference to the attached drawings.

DETAILED DESCRIPTION

Hereinafter, example embodiments for carrying out the present disclosure will be described with reference to the accompanying drawings and the like. Further, the scope of the present disclosure is not limited to the example embodiments below and may be arbitrarily changed within the scope of the technical idea of the present disclosure.

Figure 1:
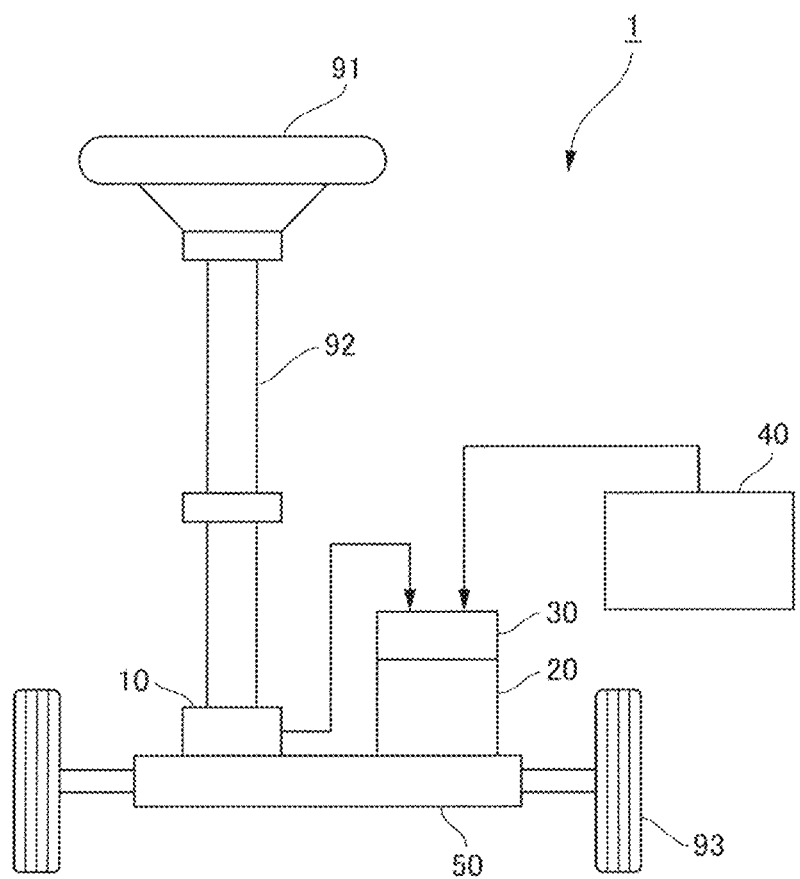
FIG. 1 is a schematic diagram of an electric power steering device including a motor drive device according to an example embodiment of the present disclosure.

FIG. 1 is a schematic diagram of an electric power steering device 1 including a motor drive device 30 according to the present example embodiment. The electric power steering device 1 is a device for assisting a driver's steering wheel operation in transportation equipment such as an automobile. As illustrated in FIG. 1, the electric power steering device 1 of the present example embodiment includes a torque sensor 10, a motor 20, and a motor drive device 30. In the present example embodiment, the motor 20 and the motor drive device 30 are incorporated in a common housing. By the motor 20 being so-called "mechanically and electrically integrated type," for example, the size of the electric power steering device 1 can be reduced.

The torque sensor 10 is attached to a steering shaft 92. When a driver operates a steering wheel 91 and cause the steering shaft 92 to rotate, the torque sensor 10 detects torque applied to the steering shaft 92. A torque signal, which is a detection signal of the torque sensor 10, is output from the torque sensor 10 to the motor drive device 30. The motor drive device 30 causes the motor 20 to be driven on the basis of the torque signal input from the torque sensor 10. Further, the motor drive device 30 may also refer to other information (for example, a vehicle speed or the like) in addition to the torque signal.

The motor drive device 30 uses power obtained from an external power supply 40 to supply a drive current to the motor 20. A drive force generated from the motor 20 is transmitted to a vehicle wheel 93 via a gearbox 50. Consequently, a steering angle of the vehicle wheel 93 is changed. In this manner, the electric power steering device 1 amplifies torque of the steering shaft 92 by the motor 20 and causes the steering angle of the vehicle wheel 93 to change. Accordingly, the driver can operate the steering wheel 91 with light force.

Figure 2:
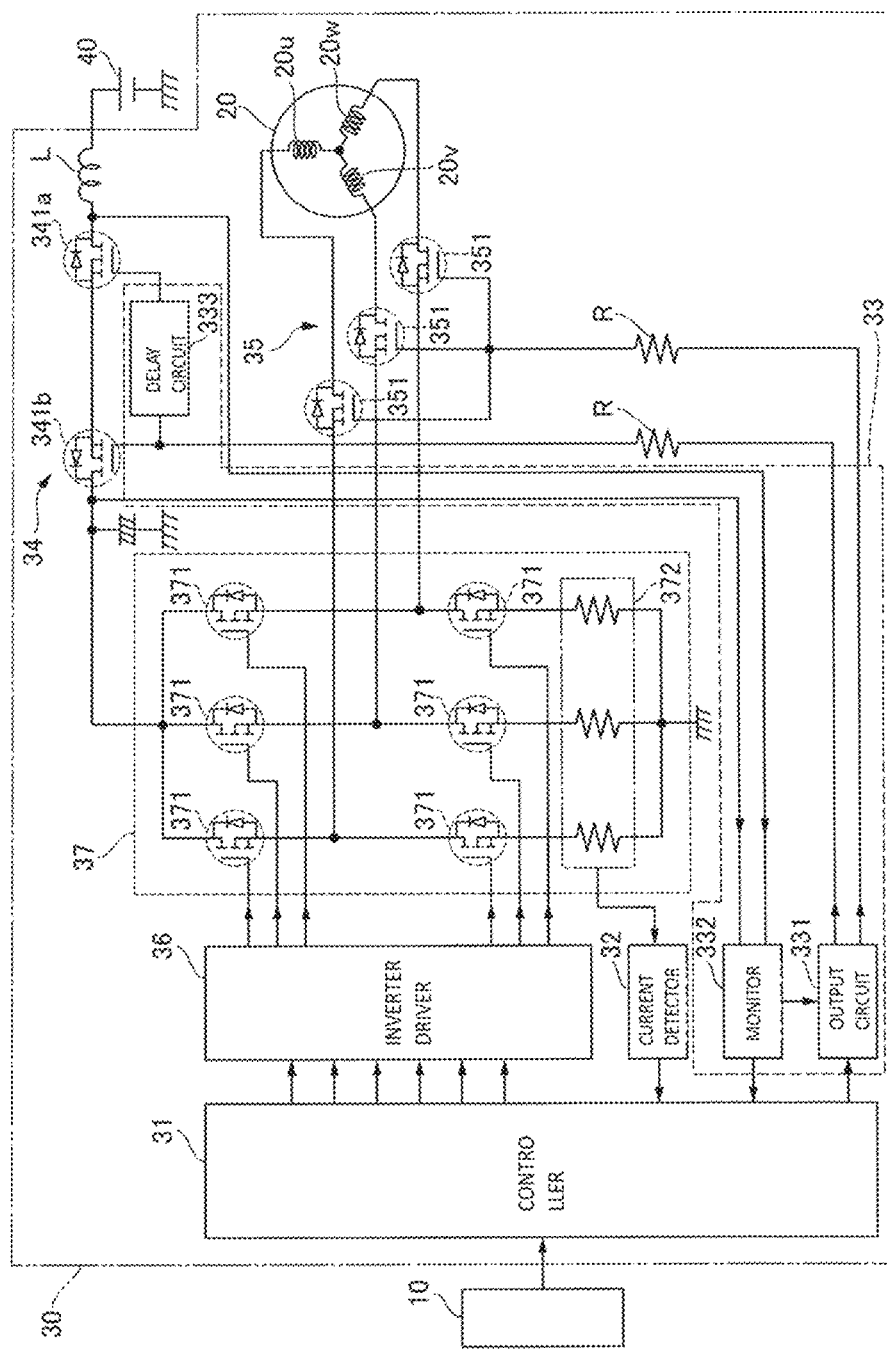
FIG. 2 is a block diagram illustrating a configuration of the motor drive device.

Next, a configuration of the motor drive device 30 will be described. FIG. 2 is a block diagram illustrating a configuration of the motor drive device 30. As illustrated in FIG. 2, the motor drive device 30 includes a controller 31, a current detector 32, a switching driver 33, a first switching circuit 34, a second switching circuit 35, an inverter driver 36, and an inverter circuit 37. Further, a limiting resistor R is disposed between the switching driver 33 and the first and second switching circuits 34 and 35.

In the present example embodiment, a three-phase synchronous brushless motor is used as the motor 20. The motor 20 is configured of coils of three phases including a U-phase 20$u$, a V-phase 20$v$, and a W-phase 20$w$. While the motor 20 is driven, current is supplied from the motor drive device 30 to each of the U-phase 20$u$, the V-phase 20$v$, and the W-phase in the motor 20. When the current is supplied, a rotational magnetic field occurs between a stator including the coils of the three-phases including the U-phase 20$u$, the V-phase 20$v$, and the W-phase 20$w$ and a rotor including a magnet. As a result, the rotor rotates with respect to the stator of the motor 20.

The controller 31 receives a torque signal output from the torque sensor 10. As the controller 31, for example, a computer including an arithmetic processor such as a central processing unit (CPU), a memory such as a random access memory (RAM), and a storage unit such as a hard disk drive is used. However, instead of the computer, an electric circuit including an arithmetic unit such as a microcontroller may also be used.

Figure 3:
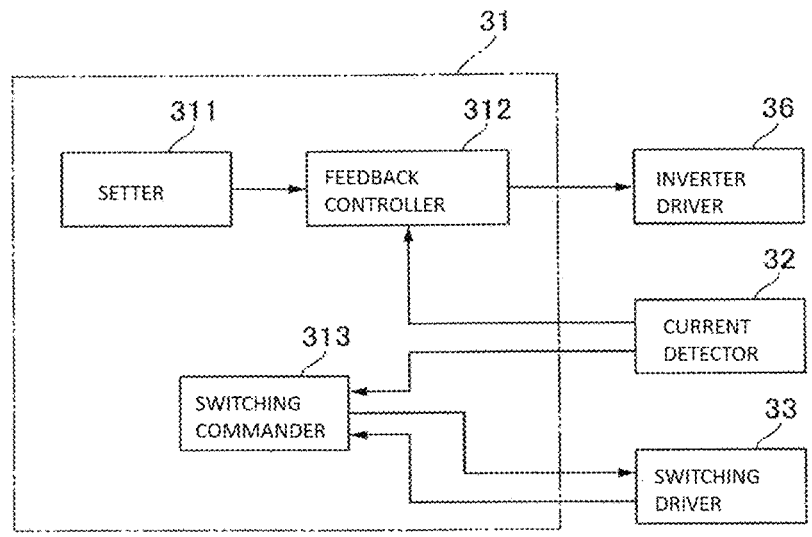
FIG. 3 is a block diagram illustrating each function of a controller according to an example embodiment of the present disclosure.

FIG. 3 is a block diagram illustrating each function of the controller 31. The controller 31 includes a setter 311, a feedback controller 312, and a switching commander 313. The setter 311 sets a drive signal for driving the motor 20 on the basis of the torque signal from the torque sensor 10.

The feedback controller 312 generates a drive signal at which a current value of current flowing through the inverter circuit 37 that is detected by the current detector 32 becomes close to a current value corresponding to the drive signal set by the setter 311. For example, in the present example embodiment, the generated drive signal is a pulse width modulation (PWM) drive signal using a PWM method and includes duty ratio information. The feedback controller 312 outputs the PWM drive signal to the inverter driver 36.

The current value of current flowing through the inverter circuit 37 that is detected by the current detector 32 is input to the switching commander 313. Also, a signal indicating that a monitor 332 in the switching driver 33 has issued an interruption command to an output circuit 331 is input to the switching commander 313. Furthermore, a result of monitoring by the monitor 332 whether overcurrent flowing through the first switching circuit 34 is present is input to the switching commander 313. Further, the output of the monitoring result to the switching commander 313 by the monitor 332 is not essential.

In a case in which the current value of the current flowing through the inverter circuit 37 is a predetermined threshold value or lower, the switching commander 313 outputs, to the output circuit 331, a conduction command voltage which causes a current supply path to be in a conducting state in the first switching circuit 34 and the second switching circuit 35. The predetermined threshold value refers to a current value of overcurrent flowing between the inverter circuit 37 and the external power supply 40 in a case in which a short circuit occurs in the inverter circuit 37 or the like.

Also, in a case in which the current value of the current flowing through the inverter circuit 37 exceeds the predetermined threshold value, the switching commander 313 outputs, to the output circuit 331, an interruption command voltage which commands interruption of connection to the first switching circuit 34 and the second switching circuit 35.

The interruption of connection refers to switching a current supply path between the external power supply 40 and the inverter circuit 37 (hereinafter referred to as "power supply line") from a conducting state to an interrupted state and switching a current supply path between the inverter circuit 37 and the motor 20 from the conducting state to the interrupted state. Each of the above-described functions can be realized on the basis of a program pre-stored in a memory in the controller 31.

Referring back to FIG. 2, the current detector 32 is an electric circuit for detecting a current flowing through shunt resistors 372 included in the inverter circuit 37. The current detector 32 measures a potential difference between both ends of three shunt resistors 372, thereby generating a detection signal indicating current flowing through each shunt resistor 372. The generated detection signal is sent from the current detector 32 to the feedback controller 312 and the switching commander 313 of the controller 31 illustrated in FIG. 3.

The switching driver 33 includes the output circuit 331, the monitor 332, and a delay circuit 333. The output circuit 331 boosts the input conduction command voltage or interruption command voltage as necessary and outputs the boosted conduction command voltage or interruption command voltage to the first switching circuit 34 and the second switching circuit 35. The monitor 332 monitors whether overcurrent flowing through the power supply line is present and outputs a monitoring result to the controller 31 and the output circuit 331. In the case of this configuration, when the overcurrent is detected by the monitor 332, an interruption instruction is issued from the monitor 332 to the output circuit 331 without passing through the controller 31. The delay circuit 333 is an electric circuit configured to delay a timing at which an input signal is output.

In a case in which the conduction command voltage is input to the output circuit 331, the output circuit 331 boosts the conduction command voltage to a voltage at which FETs included in the first switching circuit 34 and the second switching circuit 35 are turned on and outputs the boosted conduction command voltage to each switching circuit.

Turning on the FET refers to causing current to flow between a source and a drain of the FET. Also, turning off the FET refers to causing current to not flow between a source and a drain of the FET. Further, in a case in which the interruption command voltage is input to the output circuit 331, the output circuit 331 outputs an interruption command voltage which causes a potential difference between a gate and a source of the FET to be 0 V.

The monitor 332 monitors a potential difference between a drain of a first FET 341a and a drain of a second FET 341b, thereby monitoring overcurrent flowing through the power supply line. In a case in which, with the potential difference of a voltage between drains when the overcurrent flows through the power supply line as a threshold value, the voltage between the drains exceeds the threshold value, the monitor 332 determines that the overcurrent is detected. In a case in which the voltage between the drains is lower than or equal to the threshold value, the monitor 332 determines that the overcurrent is not flowing through the power supply line.

In the case in which the monitor 332 determines that the overcurrent is detected, the monitor 332 outputs a signal indicating that the overcurrent is detected to the switching commander 313. Also, in the case in which the monitor 332 determines that the overcurrent is detected, the monitor 332 outputs an interruption command to the output circuit 331. The monitor 332 outputs, to the switching commander 313, a signal indicating that the interruption command has been output to the output circuit 331. On the basis of the interruption command, the output circuit 331 outputs an interruption command voltage which commands interruption of connection to the first switching circuit 34 and the second switching circuit 35.

In the case in which the monitor 332 determines that the overcurrent does not flow through the power supply line, the monitor 332 outputs, to the switching commander 313, a signal indicating that the overcurrent does not flow through the power supply line. The output circuit 331 outputs a conduction command voltage which commands conduction of connection to the first switching circuit 34 and the second switching circuit 35.

Because the monitor 332 in the switching driver 33 can monitor whether overcurrent flowing through the power supply line is present and can issue an interruption command, the circuit configuration can be made compact.

The delay circuit 333 is an electric circuit configured to delay a timing at which an input signal is output. A time taken for a signal input to the delay circuit 333 to be output from the delay circuit 333 is referred to as delay time. In the present example embodiment, the delay time is in the order of μ seconds. The delay circuit 333 is disposed between the first switching circuit 34 and the output circuit 331. Also, the delay circuit 333 is connected to a gate of the first FET 341a and a gate of the second FET 341b.

The output circuit 331 outputs the interruption command voltage to the first switching circuit 34 and the second switching circuit 35. The delay circuit 333 causes a first timing at which the interruption command voltage is input to the gate of the first FET 341a to be later than a second timing at which the interruption command voltage is input to the gate of the second FET 341b.

By disposing the delay circuit 333 as described above, in the case in which the overcurrent is detected in the power supply line, timings at which the first FET 341a and the second FET 341b are turned off can be shifted from each other. That is, the second FET 341b may be turned off first, and then the first FET 341a may be turned off.

By shifting the timings at which the first FET 341a and the second FET 341b are turned off, the overcurrent flowing through the power supply line can be supplied to a body diode of the second FET 341b before the power supply line is interrupted, thereby reducing the overcurrent. Consequently, it is possible to prevent a surge voltage, which is generated while the power supply line is interrupted, from exceeding the maximum rating of the first FET 341a. Here, the surge voltage is also referred to as spike voltage or overvoltage.

The first switching circuit 34 is an electric circuit configured to switch the power supply line to a conducting state and an interrupted state. The first switching circuit 34 includes the first FET 341a and the second FET 341b connected in series with each other's sources from the external power supply 40. Also, the first switching circuit 34 includes a choke coil L for noise reduction disposed at the side of the external power supply 40.

The second switching circuit 35 is an electric circuit configured to switch the current supply path between the inverter circuit 37 and the motor 20 to the conducting state and the interrupted state. The second switching circuit 35 includes FETs 351 as many as the number of phases of the motor 20. Also, each drain of the FETs 351 is connected to each phase of the motor 20. According to this connection method, in a case in which a failure occurs in the inverter circuit 37 due to a short circuit or break, the inverter circuit 37 can be reliably interrupted from each phase of the motor 20 to avoid locking of the motor 20 due to the failure in the inverter circuit 37.

The inverter driver 36 is an electric circuit for causing the inverter circuit 37 to operate. In the present example embodiment, the inverter driver 36 supplies the PWM drive signal output by the feedback controller 312 illustrated in FIG. 3 to six switching elements 371 included in the inverter circuit 37.

The inverter circuit 37 is an electric circuit configured to supply the current supplied from the external power supply 40 to the motor 20. As the six switching elements 371 included in the inverter circuit 37, for example, transistors such as FETs are used. In the present example embodiment, three sets of a pair of switching elements 371 connected in series between the external power supply 40 and the ground are provided in parallel. In the present example embodiment, metal-oxide semiconductor field-effect transistors (MOSFETs) are used as the FETs 341a, 341b, and 351 and the switching elements 371.

Figure 4:
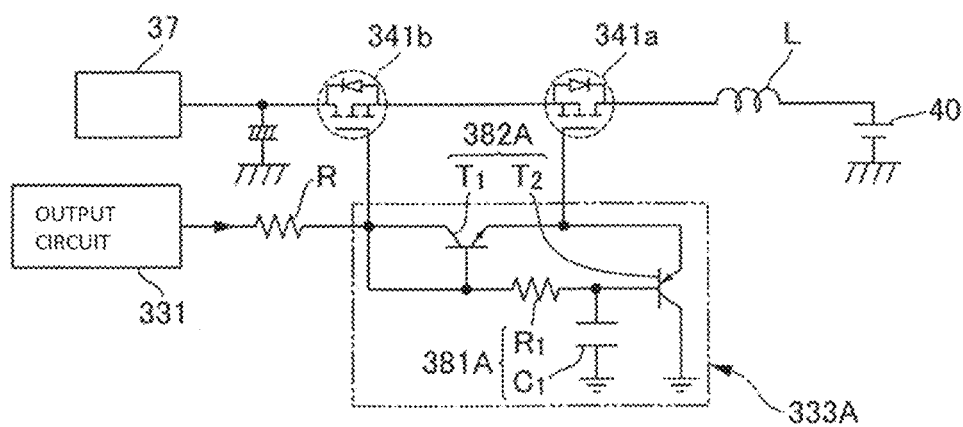
FIG. 4 is a view illustrating a configuration example of a delay circuit according to an example embodiment of the present disclosure.

FIG. 4 is a view illustrating a configuration example of the delay circuit 333. A delay circuit 333A illustrated in FIG. 4 includes a delay time determiner 381A configured to determine a magnitude of a time difference, i.e., a delay time, between a first timing and a second timing and includes a delay generator 382A configured to generate a delay time which causes the first timing to be later than the second timing. Due to this configuration, the delay time can be set in advance at the time of circuit design, and the delay can be generated at the set delay time.

The delay time determiner 381A includes a resistor R1 and a capacitor C1. Also, the delay generator 382A includes a Negative-Positive-Negative (NPN) transistor T1 and a Positive-Negative-Positive (PNP) transistor T2. The delay time may be determined on the basis of a resistance value of the resistor R1 and a capacitance value of the capacitor C1, and the delay may be generated by the NPN transistor T1 and the PNP transistor T2.

As illustrated in FIG. 4, a collector of the NPN transistor T1 is connected to the gate of the second FET 341b and an output side of the output circuit 331. A collector of the PNP transistor T2 is connected to the ground, and an emitter of the NPN transistor T1 and an emitter of the PNP transistor T2 are connected to the gate of the first FET 341a. The resistor R1 is disposed between a base of the PNP transistor T2 and a base of the NPN transistor T1, and the capacitor C1 is disposed between the base of the PNP transistor T2 and the resistor R1. The capacitor C1 is connected to the ground. Due to the above-described arrangement, the delay time may be determined on the basis of the resistance value of the resistor R1 and the capacitance value of the capacitor C1, and the delay may be generated by the NPN transistor T1 and the PNP transistor T2.

Figure 5A:
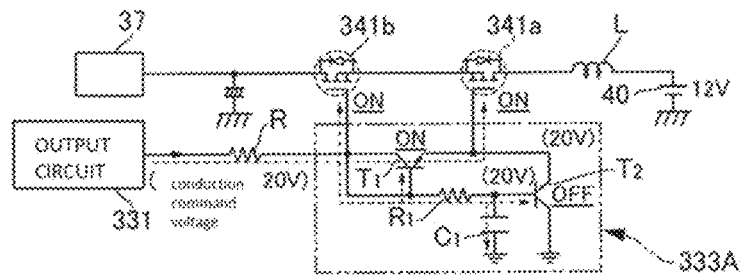
FIG. 5A is a view illustrating a power supply line in a conducting state.

FIGS. 5A to 5E are views for sequentially describing an operation of the delay circuit 333A illustrated in FIG. 4. The voltage of the external power supply 40 is 12 V. FIG. 5A is a view illustrating a power supply line in the conducting state. The first FET 341a and the second FET 341b are turned on due to the conduction command voltage from the output circuit 331. In the present example embodiment, the conduction command voltage output from the output circuit 331 is 20 V. The NPN transistor T1 is turned on for each element of the delay circuit 333A. Also, a charge is charged to the capacitor C1, and the PNP transistor T2 is turned off.

Figure 5B:
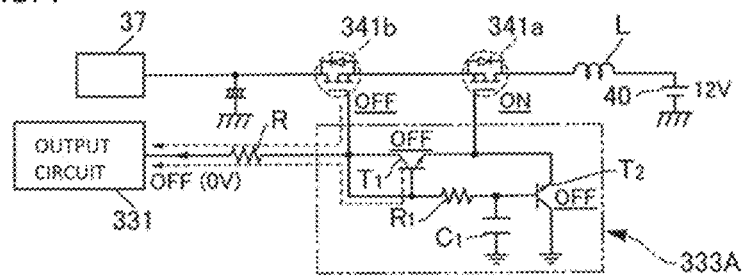
FIG. 5B is a view illustrating a condition in which a delay begins to occur while the power supply line is interrupted.

FIG. 5B is a view illustrating a condition in which a delay begins to occur while the power supply line is interrupted. When the interruption command voltage is output from the output circuit 331, the second FET 341b and the NPN transistor T1 are turned off. In the present example embodiment, the interruption command voltage is 0 V. The first FET 341a is maintained to be on until a charge of parasitic capacitance disappears. That is, a delay occurs.

Figure 5C:
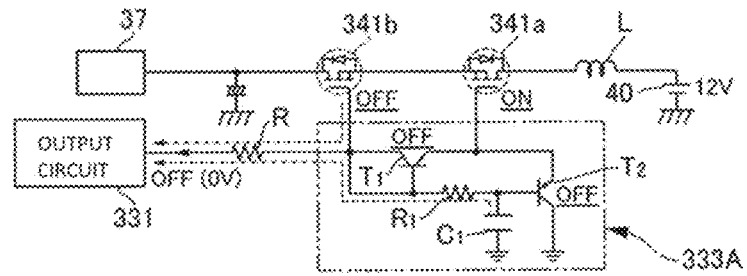
FIG. 5C is a view illustrating a condition in which the delay is in progress.

FIG. 5C is a view illustrating a condition in which the delay is in progress while the power supply line is interrupted. After FIG. 5B, the charge stored in the capacitor C1 is gradually released toward the switching driver 33. At this time, as the capacitance value of the capacitor C1 and the resistance value of the resistor R1 are higher, it is more difficult for the charge to be released. That is, the delay time increases as the capacitance value of the capacitor C1 and the resistance value of the resistor R1 become higher.

Figure 5D:
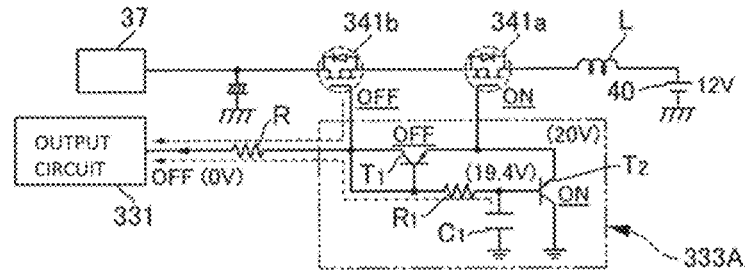
FIG. 5D is a view illustrating a condition in which the delay is reaching completion.

FIG. 5D is a view illustrating a condition in which the delay is reaching completion while the power supply line is interrupted. After FIG. 5C, because the charge stored in the capacitor C1 is released, a voltage between both ends of the capacitor C1 is also decreased. As a result, the potential difference between the base and the emitter of the PNP transistor T2 increases. In the present example embodiment, a transistor that is turned on when the potential difference between the base and the emitter is 0.6 V or more is used as the PNP transistor T2. Accordingly, as the voltage between the both ends of the capacitor C1 drops, the PNP transistor T2 is turned on when the potential difference between the base and the emitter of the PNP transistor T2 reaches 0.6 V.

Figure 5E:
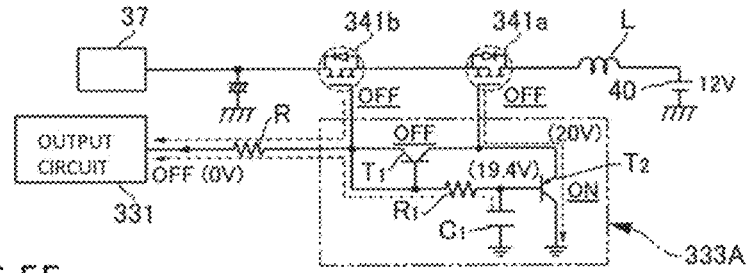
FIG. 5E is a view illustrating a condition in which the delay is completed.

FIG. 5E is a view illustrating a condition in which the delay is completed while the power supply line is interrupted. After FIG. 5D, the charge of the parasitic capacitance of the first FET 341a is released toward the PNP transistor T2. The first FET 341a is turned off when the charge of the parasitic capacitance is completely released. The delay circuit 333A operates as described above.

Figure 6:
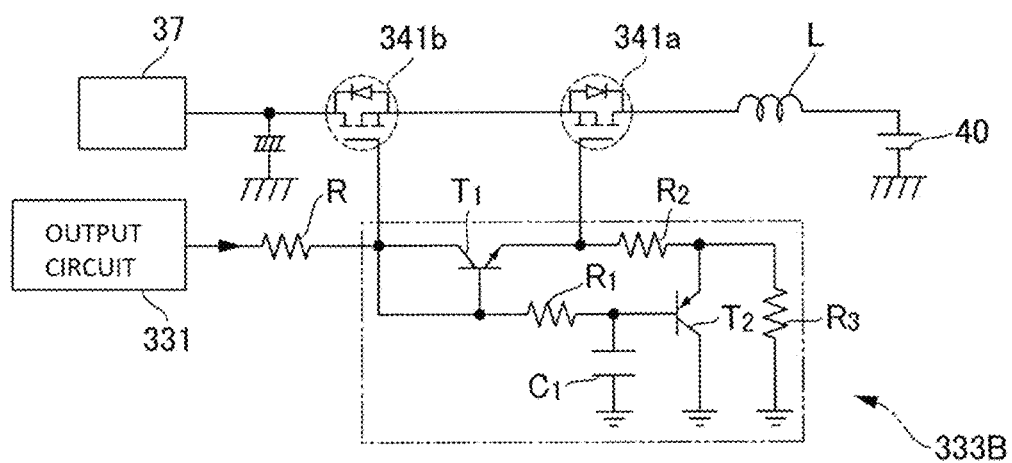
FIG. 6 is a view illustrating a configuration of a delay circuit according to a first modified example embodiment of the present disclosure.

FIG. 6 is a view illustrating a modified example of the delay circuit 333. In a delay circuit 333B illustrated in FIG. 6, a resistor R2 is disposed between an emitter of a PNP transistor T2 and a gate of a first FET 341a, and a resistor R3 is disposed at the emitter of the PNP transistor T2. The resistor R3 is connected to the ground. The delay circuit 333B can cause a delay time to be longer than that of the delay circuit 333A.

As described above, according to the present example embodiment and the present modified example, a motor drive device is provided which is advantageous in terms of safety of operation of an FET included in a switching circuit disposed on a power supply line. Also, in an electric power steering device that is particularly required to be safe, the demand for safety can be met by providing the motor drive device according to the present example embodiment and the present modified example.

Figure 7:
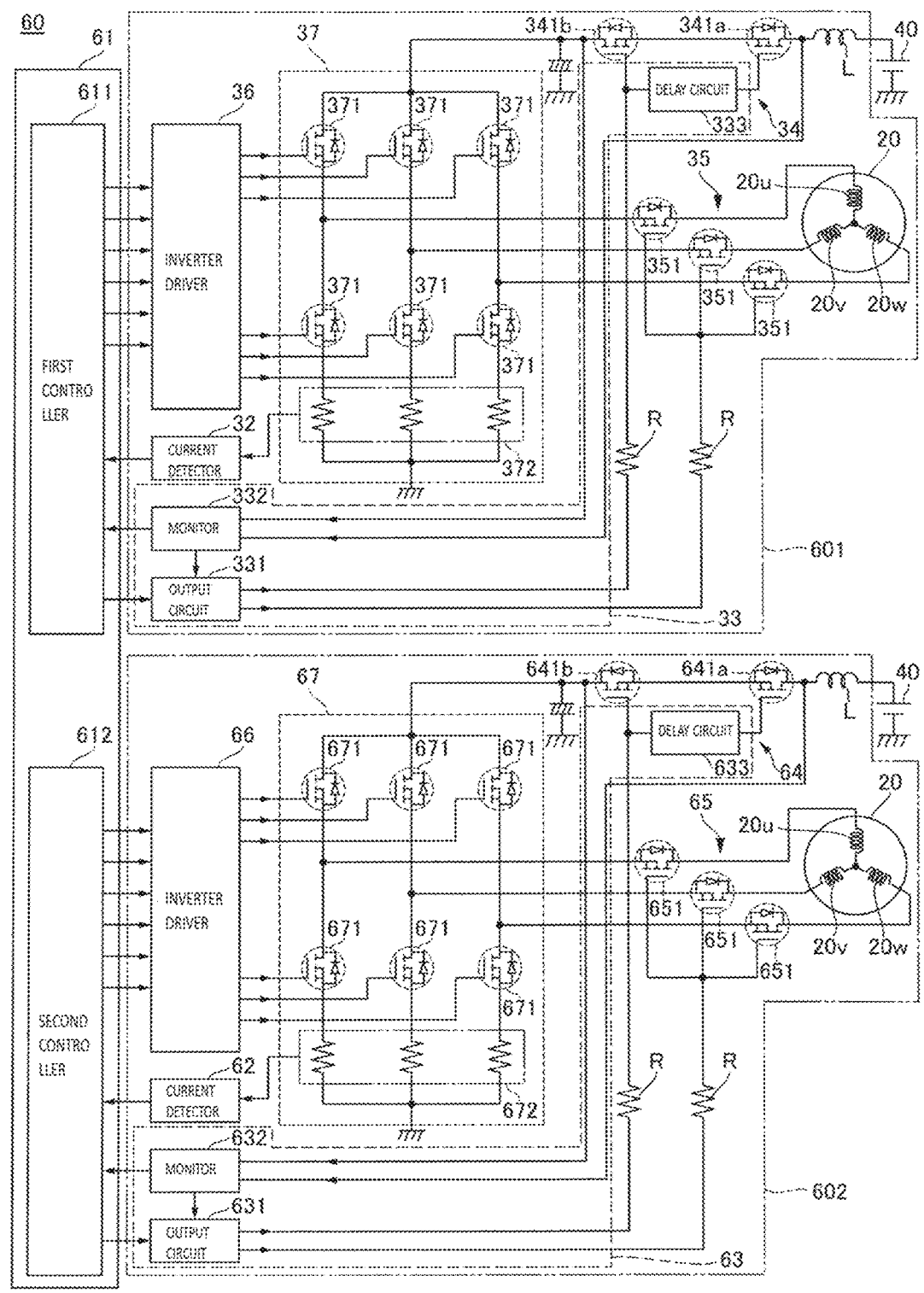
FIG. 7 is a block diagram illustrating a configuration of a motor drive device in a case in which two motors are controlled.

Although the case in which the controller 31 controls a single motor has been described above in relation to the example embodiment and the modified example, the number of motors controlled is not limited to one. For example, two motors may be controlled. FIG. 7 is a block diagram illustrating a configuration of a motor drive device in a case in which two motors are controlled. In this case, the electric power steering device 1 includes two motors 20.

A combination between the motor 20 and the current detector 32, the switching driver 33, the first switching circuit 34, the second switching circuit 35, the inverter driver 36, and the inverter circuit 37 illustrated in FIG. 2 is assumed to be a first system 601. In addition to the first system 601, a motor drive device 60 of FIG. 7 includes a second system 602 having the same combination as the first system 601. That is, the second system 602 includes a current detector 62, a switching driver 63, a first switching circuit 64, a second switching circuit 65, an inverter driver 66, an inverter circuit 67, and a motor 20. The switching driver 63 includes an output circuit 631, a monitor 632, and a delay circuit 633.

The motor drive device 60 includes a controller 61 including a first controller 611 and a second controller 612. The first controller 611 performs control of the first system 601, and the second controller 612 performs control of the second system 602. In a case in which one of the first system 601 and the second system 602 fails, it is possible to continue operation of the electric power steering device 1 using the other system. By using the motor drive device including the two systems, it is possible to improve safety of the electric power steering device. Further, in the case in which the motor drive device including a plurality of systems is used, it is necessary to design each system so as not to affect each other.

In the example embodiment, when seen from the side of the controller 31, the output circuit 331 and the delay circuit 333 are disposed sequentially in that order. In the present modified example, the order of the output circuit and the delay circuit can be changed. That is, the delay circuit is disposed between the output side of the controller 31 and the input side of the output circuit.

Because timings at which an interruption command voltage is output from the output circuit can be shifted by disposing the delay circuit at the input side of the output circuit, it is possible to turn off the second FET 341b first and then turn off the first FET 341a. By turning off the second FET 341b first, it is possible to supply the overcurrent flowing through the power supply line to the body diode of the second FET 341b and then interrupt the power supply line. Accordingly, it is possible to prevent a failure of the first FET 341a by suppressing a surge voltage that occurs while the power supply line is interrupted.

Figure 8:
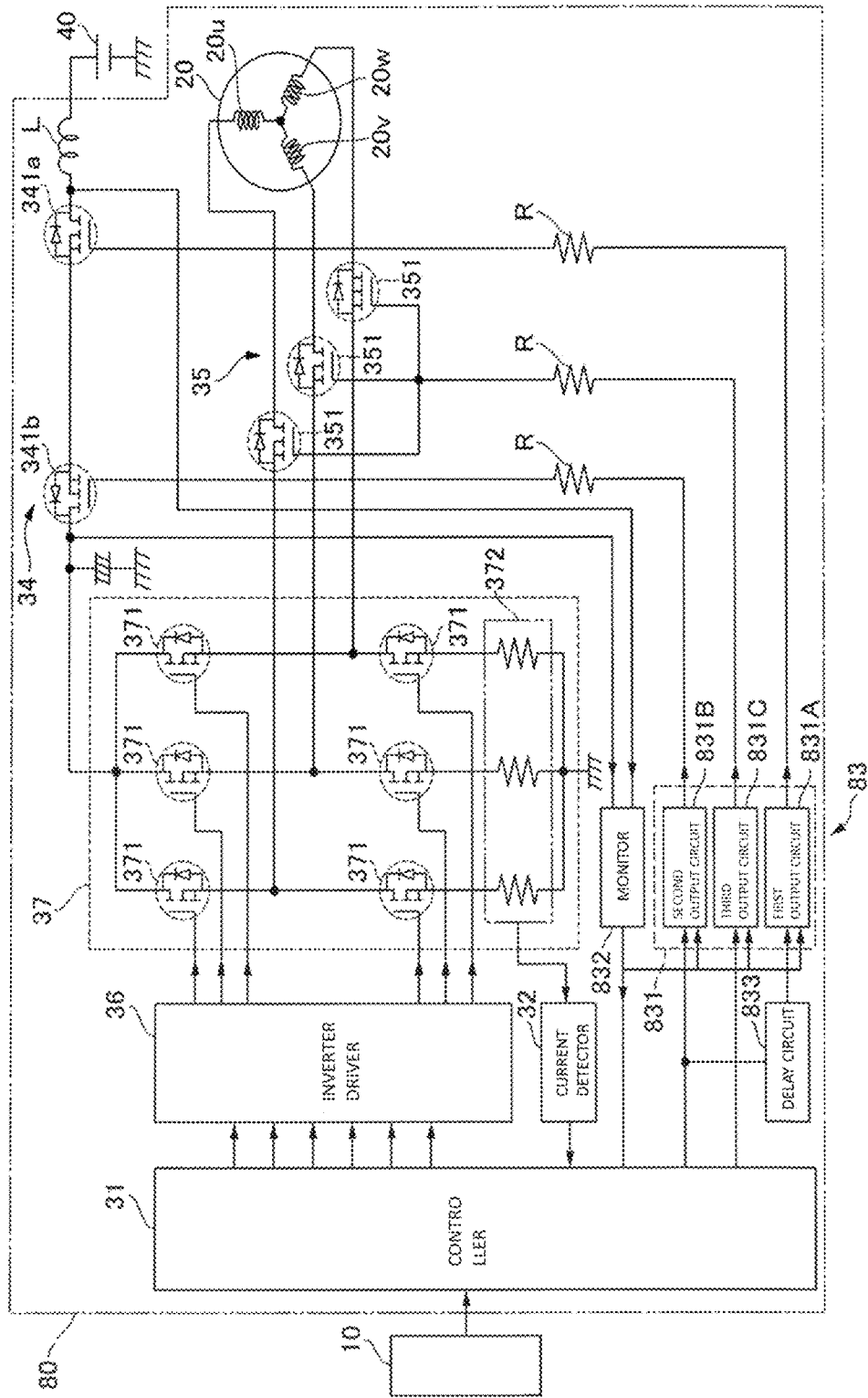
FIG. 8 is a block diagram illustrating a configuration of a motor drive device according to a second modified example embodiment of the present disclosure.

FIG. 8 is a block diagram illustrating a configuration of a motor drive device 80 of the present modified example. Configurations which are the same as those in the example embodiment illustrated in FIG. 2 will be denoted by like reference numerals, and description thereof will be omitted. The motor drive device 80 includes a switching driver 83.

The switching driver 83 includes an output circuit 831, a monitor 832, and a delay circuit 833. The output circuit 831 includes a first output circuit 831A, a second output circuit 831B, and a third output circuit 831C. The first output circuit 831A inputs a conduction command voltage or an interruption command voltage to a gate of a first FET 341a. The second output circuit 831B inputs a conduction command voltage or an interruption command voltage to a gate of the second FET 341b. The third output circuit 831C inputs a conduction command voltage or an interruption command voltage to each gate of an FET 351.

Figure 9:
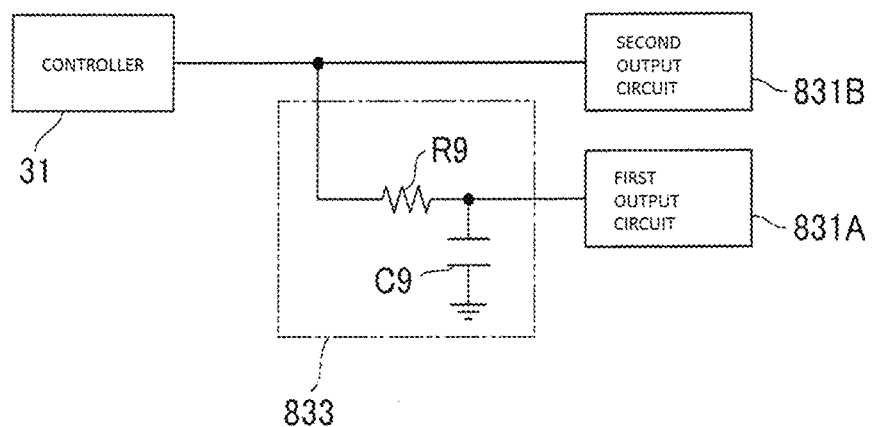
FIG. 9 is a view illustrating a configuration of a delay circuit according to a third modified example embodiment of the present disclosure.

FIG. 9 is a view illustrating a configuration example of the delay circuit 833. The delay circuit 833 includes a resistor R9 and a capacitor C9. A delay time may be determined on the basis of a resistance value of the resistor R9 and a capacitance value of the capacitor C9.

Further, it is possible to configure the delay circuit 333 using only a resistor. Because parasitic capacitance is present between a gate and a source in the first FET 341a connected to the delay circuit 333, a delay time of some μ seconds is secured even when only the resistor is used without the capacitor or the like in the delay circuit 333.

On the other hand, it is also possible to configure the delay circuit 833 using only a resistor. However, because the first output circuit 831A connected to the delay circuit 833 does not include an element having parasitic capacitance, a delay time which is as long as that in the case in which the delay circuit 333 is configured using only a resistor is not secured.

The motor 20 is not limited to having three phases. Also, the motor drive device 30, 60, or 80 may be applied to devices other than the electric power steering device. For example, the motor drive device 30, 60, or 80 may cause a motor used in other portions of transportation equipment such as an automobile to be driven. Also, the motor drive device 30, 60, or 80 may cause a motor mounted in equipment other than an automobile, such as an industrial robot, to be driven.

Also, instead of providing the monitor 332 or the monitor 632, the controller 31 may monitor the potential difference between the drain of the first FET 341a and the drain of the second FET 341b to monitor the overcurrent flowing through the power supply line.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A motor drive device that drives a motor, the motor drive device comprising:
an inverter circuit to supply a current supplied from an external power supply to the motor;
a switching circuit to switch a current supply path between the external power supply and the inverter circuit to a conducting state and an interrupted state; and
a switching driver to output a voltage which commands a switching operation to the switching circuit; wherein
the switching circuit includes a first field-effect transistor (FET) and a second FET connected in series with sources of each other in order from a side of the external power supply; and
the switching driver includes:
an output circuit to output an interruption command voltage that commands switching of the current supply path from the conducting state to the interrupted state in a case in which a potential difference between a drain of the first FET and a drain of the second FET exceeds a predetermined threshold value; and
a delay circuit to cause a first timing at which the interruption command voltage is input to a gate of the first FET to be later than a second timing at which the interruption command voltage is input to a gate of the second FET.

2. The motor drive device according to claim 1, wherein the delay circuit is disposed at an output side of the output circuit and is connected to the gate of the first FET and the gate of the second FET.

3. The motor drive device according to claim 1, wherein the delay circuit is disposed at an input side of the output circuit.

4. The motor drive device according to claim 1, wherein the delay circuit includes a delay time determiner to determine a magnitude of a time difference between the first timing and the second timing and a delay generator to generate the time difference.

5. The motor drive device according to claim 4, wherein the delay generator includes a Negative-Positive-Negative (NPN) transistor and a Positive-Negative-Positive (PNP) transistor; and
the delay time determiner includes a resistor and a capacitor.

6. The motor drive device according to claim 5, wherein a collector of the NPN transistor is connected to the gate of the second FET and an output side of the switching driver;
a collector of the PNP transistor is connected to a ground;
an emitter of the NPN transistor and an emitter of the PNP transistor are connected to the gate of the first FET;
the resistor is disposed between a base of the PNP transistor and a base of the NPN transistor; and
the capacitor, which is connected to the ground, is disposed between the base of the PNP transistor and the resistor.

7. The motor drive device according to claim 6, wherein a resistor is disposed between the emitter of the PNP transistor and the gate of the first FET; and
a resistor, which is connected to the ground, is connected to the emitter of the PNP transistor.

8. The motor drive device according to claim 1, wherein the potential difference is measured by the switching driver.

9. An electric power steering device comprising a motor driven by the motor drive device according to claim 1.

* * * * *